United States Patent [19]

Carley et al.

[11] Patent Number: 5,146,179

[45] Date of Patent: Sep. 8, 1992

[54] FULLY DIFFERENTIAL OPERATIONAL AMPLIFIER HAVING FREQUENCY DEPENDENT IMPEDANCE DIVISION

[75] Inventors: L. Richard Carley, Murrysville; Katsufumi Nakamura, Pittsburgh, both of Pa.

[73] Assignee: Carnegie Mellon University, Pittsburgh, Pa.

[21] Appl. No.: 800,845

[22] Filed: Nov. 29, 1991

[51] Int. Cl.$^5$ .......................... H03F 3/45; H03F 3/16
[52] U.S. Cl. ............................ 330/253; 330/277
[58] Field of Search ............ 330/253, 258, 260, 277, 330/292, 294, 85, 257

[56] References Cited

U.S. PATENT DOCUMENTS

| | | | |
|---|---|---|---|
| 4,656,437 | 4/1987 | Saari | 330/253 |
| 4,658,219 | 4/1987 | Saari | 330/253 |
| 4,667,165 | 5/1987 | DeWeck | 330/253 |
| 4,668,919 | 5/1987 | deWeck | 330/253 |
| 4,749,956 | 6/1988 | Torelli et al. | 330/253 |
| 4,797,631 | 1/1989 | Hsu et al. | 330/253 |
| 4,820,998 | 4/1989 | Roessler et al. | 330/253 X |
| 4,933,644 | 6/1990 | Fattaruso et al. | 330/258 |
| 4,958,133 | 9/1990 | Bazes | 330/253 |
| 4,963,834 | 10/1990 | Yukawa | 330/253 |
| 4,965,468 | 10/1990 | Nicollini et al. | 307/362 |

OTHER PUBLICATIONS

*A Wide-Band Operational Amplifier with a New Output Stage and a Simple Frequency Compensation,* R. J. Van De Plassche, IEEE Journal of Solid-State Circuits, vol. SC-6, No. 6, Dec. 1971, pp. 347-352.

*MOS Operational Amplifier Design—A Tutorial Overview,* P. R. Gray et al., IEEE Circuits, vol. SC-17, No. 6, Dec. 1982, pp. 969-982.

*Circuit and Technology Considerations for High Frequency Switched-Capacitor Filters,* R. T. Kaneshiro, Electronics Research Laboratory, Memorandum No. UCB/ERL M83/42, Jul. 1983, pp. 1-124.

*Regular Correspondence on the Operation of Cascode Gain Stages,* A. A. Abidi, IEEE Journal of Solid-State Circuits, vol. 23, No. 6, Dec. 1988, pp. 1434-1440.

*Primary Examiner*—Steven Mottola
*Attorney, Agent, or Firm*—Bell, Seltzer, Park & Gibson

[57] ABSTRACT

A fully differential operational amplifier includes first and second frequency dependent impedance dividers, preferably frequency dependent current dividers, each of which has an input, a noninverting output and an inverting output. A respective input is coupled to a differential input signal. The noninverting output of the first frequency dependent impedance divider is electrically coupled to the inverting output of the second frequency dependent impedance divider, and the noninverting output of the second impedance divider is electrically coupled to the inverting output of the first divider. A current feedback buffer electrically couples the noninverting output of a respective frequency dependent impedance divider to its associated input. The cross coupling and current feedback buffers provide positive feedback action which merges the inverting and noninverting differential signals as a function of frequency. The frequency dependent impedance dividers preferably deliver substantially all of the current at the input thereof to the associated inverted output at relatively low frequencies (DC) and split the current at the input between the associated inverting and noninverting outputs at relatively high frequencies. Each frequency dependent current divider may be implemented by a pair of cascode transistors one of which is loaded by a cascoded current mirror. High DC gain coupled with high and symmetric slew rate and high common mode rejection is thereby provided.

21 Claims, 2 Drawing Sheets

FULLY DIFFERENTIAL OPERATIONAL AMPLIFIER HAVING FREQUENCY DEPENDENT IMPEDANCE DIVISION

FIELD OF THE INVENTION

This invention relates to operational amplifiers, and more particularly to fully differential operational amplifiers having a pair of differential input terminals and a pair of differential output terminals.

BACKGROUND OF THE INVENTION

Operational amplifiers are widely used in electronic applications. A typical operational amplifier includes an output terminal, for producing an output signal which is proportional to the difference between two input signals applied to first and second input terminals. Mathematically, operational amplifiers may be characterized by the relationship $V_{out}=A(V_{in}{}^+ - V_{in}{}^-)$ where $V_{out}$ is the output voltage of the operational amplifier, $V_{in}{}^+$ and $V_{in}{}^-$ are the two differential input voltages of the operational amplifier and A is the gain of the operational amplifier.

U.S. Pat. No. 4,963,834 to Yukawa illustrates an operational amplifier as described above, including an input differential stage to which the differential input terminals are connected, two folded cascode stages connected to the differential input stage, an inverting amplifier including two transistors for receiving outputs of the first and second cascode stages, a current mirror inserted between the folded cascode stage and one of the two transistors, and an output terminal connected to a connecting point of the two transistors. One of the two transistors is driven by the output of the second folded cascode stage, and the other of the two transistors is driven through the current mirror by the output of the first folded cascode stage, so that an amplified output is supplied from the output terminal. Other operational amplifiers are described in U.S. Pat. No. 4,797,631 to Hsu et al. and U.S. Pat. No. 4,958,133 to Bazes.

A special type of operational amplifier is the fully differential operational amplifier. A fully differential operational amplifier includes a pair of differential output terminals in addition to a pair of differential input terminals. Accordingly, the mathematical relationship for a fully differential amplifier may be expressed as $V_{out}{}^+ - V_{out}{}^- = A(V_{in}{}^+ - V_{in}{}^-)$, where $V_{out}{}^+$ and $V_{out}{}^-$ are the output voltages of the differential output terminals. Fully differential amplifiers are widely used in many modern analog sampled-data applications. These applications include oversampled analog-to-digital converters, multistep analog-to-digital converters and switched capacitor filters. Also, many of these high speed applications require a high DC (open loop) gain, a high slew rate limit and high common mode rejection.

The need for faster fully differential operational amplifiers has resulted in the use of a current steering technique, also referred to as a folded cascode, for high performance applications. Fully differential operational amplifiers typically include a differential input circuit and a pair of folded cascode amplifiers. Unfortunately, it has been found that this type of fully differential amplifier is slew rate limited, does not have a symmetric slew rate and may require auxiliary circuits to reject common mode variations and provide common mode biasing.

A fully differential FET operational amplifier of the folded cascode type is described in U.S. Pat. No. 4,658,219 to Saari. Saari includes a second cascode transistor having its source connected to the source of a first cascode transistor, and its drain connected to the source of a pull down transistor, so that the pull down transistor feeds part of the signal to the output node as a cascode device. With this arrangement, the width-to-length ratios of the transistors connected to the output node can be substantially reduced for an increase in the output impedance, while the output current drive capability of the amplifier is maintained. This results in an amplifier with increased open loop gain and reduced distortion. Other fully differential operational amplifiers are described in U.S. Pat. Nos. 4,656,437 to Saari; 4,667,165 to De Weck; 4,668,919 to De Weck; 4,749,956 to Torelli et al.; 4,933,644 to Fattaruso et al.; and 4,965,468 to Nicollini et al.

Notwithstanding the extent of developmental activity noted above, modern applications of fully differential amplifiers require ever increasing DC gain, improved common mode rejection and higher symmetrical slew rate.

SUMMARY OF THE INVENTION

It is therefore an object of the present invention to provide an improved fully differential operational amplifier.

It is another object of the present invention to provide a fully differential operational amplifier having relatively high DC gain and improved common mode rejection, and relatively high and symmetric slew rate.

These and other objects are provided according to the present invention by a fully differential operational amplifier which includes first and second frequency dependent impedance dividers, each of which has an input, a noninverting output and an inverting output. A respective input is coupled to a respective one of the differential input signals. The noninverting output of the first frequency dependent impedance divider is electrically coupled to the inverting output of the second frequency dependent impedance divider, and the noninverting output of the second impedance divider is electrically coupled to the inverting output of the first divider.

The fully differential operational amplifier of the present invention also includes first and second current feedback buffers, each of which has an input and an output. The input and the output of the first current feedback buffer are electrically connected to the inverting output of the second frequency dependent impedance divider and to the input of the first frequency dependent impedance divider, respectively. Also, the input and the output of the second current feedback buffer are electrically connected to the inverting output of the first frequency dependent impedance divider and to the input of the second frequency dependent impedance divider, respectively. This cross coupling of two frequency dependent impedance dividers along with current feedback buffers provides differential positive feedback which merges the inverting and non-inverting differential current signal as a function of frequency. High DC gain coupled with high and symmetric slew rate and high common mode rejection is thereby provided. A single-ended amplifier using a frequency dependent impedance divider and a current feedback buffer may also be provided.

In particular, the fully differential amplifier of the present invention comprises an input differential stage having first and second differential input stage terminals for receiving a pair of differential input signals, and first and second differential stage outputs. The fully differential amplifier also comprises first and second frequency dependent impedance dividing means, each having an input, a noninverting output and an inverting output. The input of the first frequency dependent impedance dividing means is electrically connected to the first differential stage output, and the input of the second frequency dependent impedance dividing means is electrically connected to the second differential stage output. The noninverting output of the first frequency dependent impedance dividing means is connected to the inverting output of the second frequency dependent impedance dividing means, and the inverting output of the first frequency dependent impedance dividing means is electrically connected to the noninverting output of the second frequency dependent impedance dividing means. The noninverting output of the second frequency dependent impedance dividing means is electrically connected to the first output terminal of the differential amplifier and the noninverting output of the first frequency dependent impedance dividing means is electrically connected to the second output terminal of the fully differential amplifier. A first current feedback buffer is electrically connected between the noninverting output and the input of the first frequency dependent impedance dividing means. A second current feedback buffer is electrically connected between the noninverting output and the input of the second frequency dependent impedance dividing means.

The input differential stage is preferably a transconductance amplifier, for converting a differential input voltage between the first and second differential input stage terminals into differential output currents at the first and second differential stage outputs. Each frequency dependent impedance divider preferably comprises a frequency dependent current divider, which delivers substantially all of the current at the input thereof to the associated inverting output thereof at relatively low frequencies (DC), and splits the current at the input between the associated inverting and noninverting outputs at relatively high frequencies.

Since the current divider delivers all of its input current to its inverting output path at low frequencies, infinite close loop current multiplication results at low frequencies. High DC gain is therefore obtained. At higher frequencies, in order to frequency compensate for excess phase shift, each current divider splits its input current between its inverting and noninverting paths. In one embodiment the current may be split approximately equally. In other embodiments, different fractions of current splitting may be used. Current splitting reduces current to the positive feedback loop and therefore greatly reduces the closed loop current multiplication.

The capacitive loading applied at the differential outputs of the operational amplifier determines the frequency dependence of the current dividers. When the output impedance becomes capacitive due to the load capacitance, the current dividers split their input currents equally into the corresponding inverting and noninverting outputs.

In a preferred embodiment of the invention, the first frequency dependent impedance divider includes first and second cascode transistors, each of which is electrically coupled to the input of the first frequency dependent impedance divider. Similarly, the second frequency dependent impedance divider includes third and fourth cascode transistors, each of which is electrically coupled to the input of second frequency dependent impedance divider. The first cascode transistor is loaded by the output terminal of a first cascoded current mirror. The third cascode transistor is loaded by the output terminal of a second cascoded current mirror. High output impedance of the cascoded current mirror causes the associated cascode transistor to exhibit a high impedance at low frequencies. Capacitive loading, also applied at the differential outputs of the operational amplifier, causes the associated cascode transistor to exhibit a low impedance at high frequencies.

The second cascode transistor is loaded by the input terminal of the second cascoded current mirror. The fourth cascode transistor is loaded by the input terminal of the first cascoded current mirror. Low input impedance of the cascoded current mirror causes the associated cascode transistor to exhibit a low impedance at low frequencies. This impedance remains low at high frequencies. Accordingly, since more current flows into a low impedance path compared to a high impedance path, a frequency dependent impedance divider is provided. The impedance divider delivers its input current signal substantially to its inverting output at low frequencies, thereby providing current positive feedback loop for the operational amplifier at low frequencies, and splits the input current signal between its inverting and noninverting outputs at high frequencies, to reduce the current to the positive feedback loop.

A fully differential amplifier according to the present invention may be implemented using complementary Field Effect Transistors (FETs). First and second FETs of first conductivity type may have their sources electrically connected together and their gates electrically connected to a respective one of the amplifier's differential input terminals. Third and fourth FETs of second conductivity type may be provided, with the source of the third FET being electrically connected to the drain of the first FET, and the drain of the third FET being electrically connected to the second output terminal. The source of the fourth FET is electrically connected to the drain of the second FET and the drain of the fourth FET is electrically connected to the first output terminal. Fifth and sixth FETs of the second conductivity type may also be provided, with the source of the fifth FET electrically connected to the drain of the second FET, and the source of the sixth FET electrically connected to the drain of the first FET. Finally, first and second cascoded current mirrors may be provided, each of which includes an input and an output. The input of the first cascoded current mirror is connected to the drain of the fifth FET, and the output of the first cascoded current mirror is connected to the drain of the third FET. The input of the second cascoded current mirror is connected to the drain of the sixth FET and the output of the second cascoded current mirror is connected to the drain of the fourth FET.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
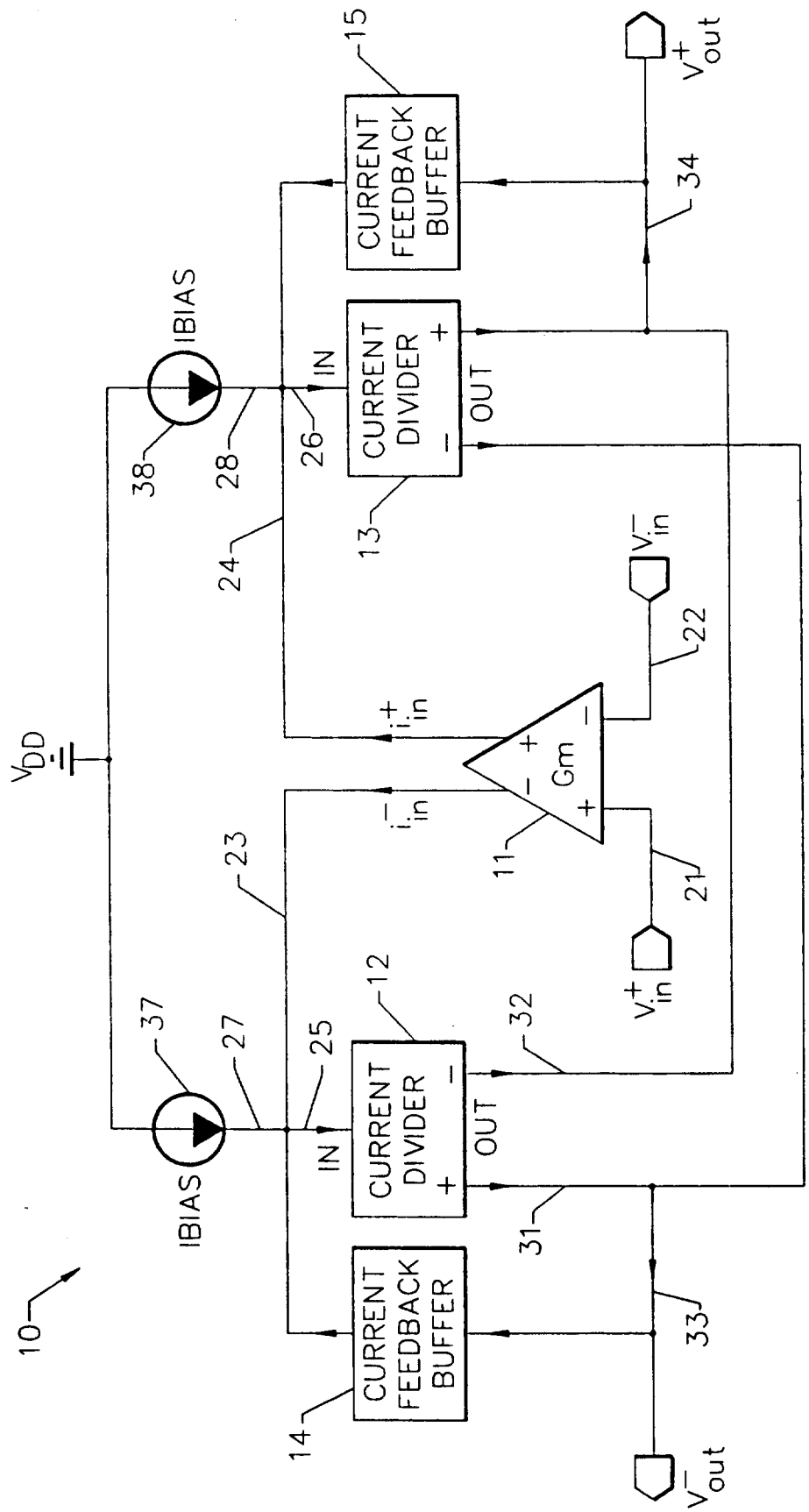
FIG. 1 is a schematic block diagram of a fully differential operational amplifier according to the present invention.

Referring now to FIG. 1, a schematic block diagram of a fully differential amplifier according to the present invention is shown. Fully differential amplifier lo includes a pair of differential inputs $V_{in}^+$, $V_{in}^-$ and a pair of differential outputs $V_{out}^+$ and $V_{out}^-$. The input signals are applied to a pair of differential input terminals 21, 22 which are applied to an input differential stage 11. Preferably, differential stage 11 comprises a transconductance amplifier ($G_m$), which converts differential input voltage between lines 21 and lines 22 (i.e. $V_{in}^+ - V_{in}^-$) to differential output currents on lines 23 and 24 (i.e. $i_{in}^+ - i_{in}^-$).

A pair of frequency dependent impedance dividers 12 and 13 are also included. Preferably, impedance dividers 12 and 13 are frequency dependent current dividers, for distributing the current at the associated input 25, 26, between noninverting (+) and inverting (−) outputs. As shown, the input 25 of the first frequency dependent current divider 12 is electrically connected to the inverting output 23 of the transconductance amplifier 11, and the input 26 of the second current divider 13 is electrically connected to the positive current output 24 of transconductance amplifier 11. A pair of bias sources 37 and 38 also provide bias current via lines 27 and 28 respectively.

The outputs of first and second current dividers 12, 13 are cross coupled to merge the inverting and noninverting differential current signals. In particular, the noninverting (+) output of first current divider 12 is connected to the inverting (−) output of the second current divider 13 via line 31. The inverting (−) Output of the first current divider 12 is connected to the noninverting (+) output of the second current divider 13 via line 32. Line 31 is electrically connected to the negative output terminal 33 of the fully differential amplifier 10, while line 32 is electrically connected to the positive output terminal 34 of the fully differential amplifier. Current feedback buffers 14 and 15 deliver the sum of the resulting output currents from each current divider to the original current summing nodes at the inputs of the current divider.

In the preferred embodiment, each current divider 12, 13 delivers substantially all Of its input current to its inverting (−) output at low frequencies. Accordingly, the cross coupled outputs of the current dividers and current feedback buffers provide an infinite closed loop current multiplication at DC. High DC gain therefore results. At higher frequencies, the current divider divides its input current substantially equally between the noninverting (+) and inverting (−) outputs thereof. This compensates for excessive phase shift by terminating the current positive feedback loop, thereby greatly reducing DC gain by reducing the closed-loop current multiplication.

Figure 2:
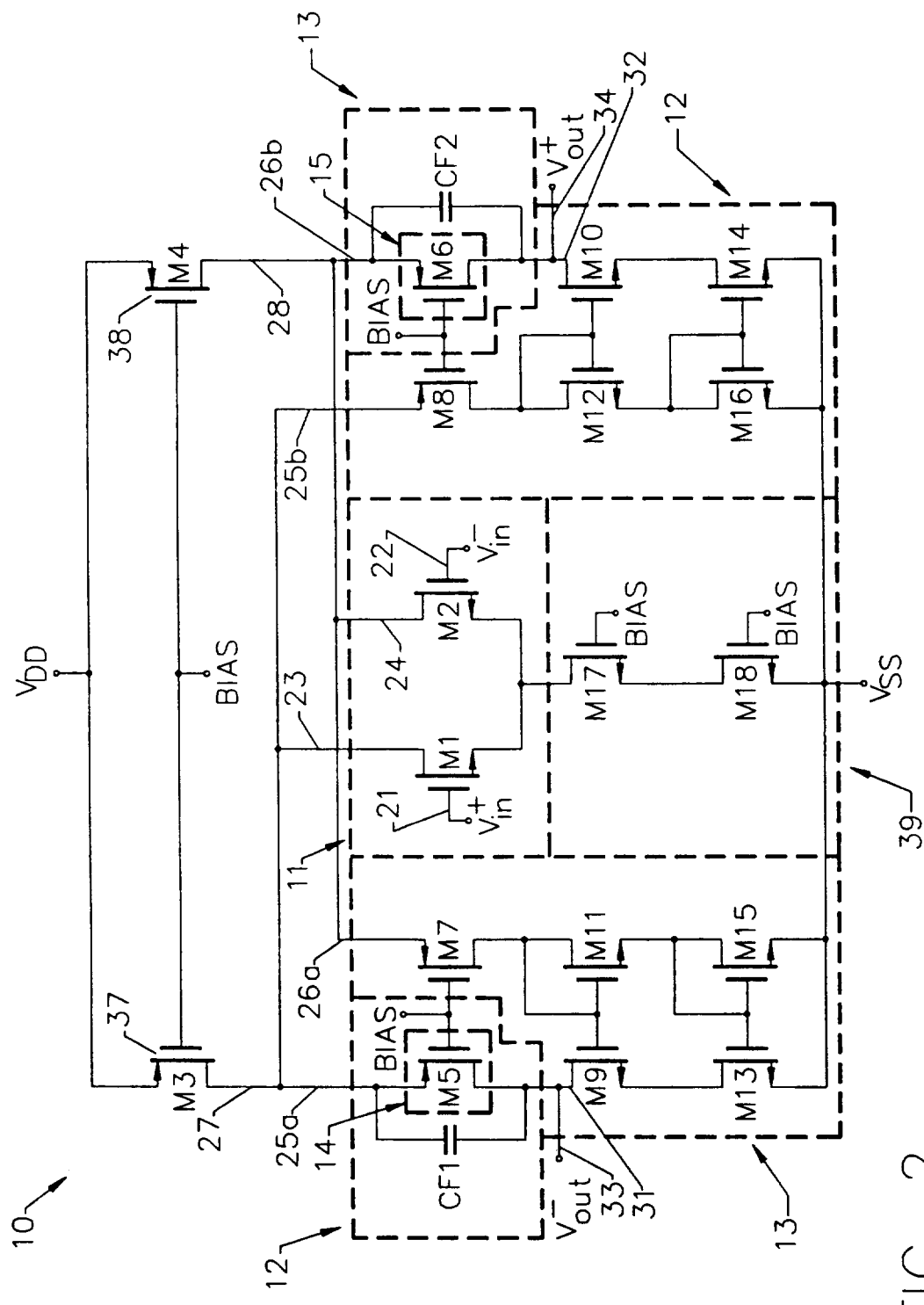
FIG. 2 is a schematic circuit diagram of a complementary FET embodiment of the fully differential operational amplifier of FIG. 1.

Referring now to FIG. 2, a schematic circuit diagram of a preferred embodiment of the fully differential operational amplifier of FIG. 1 will now be described. As shown in FIG. 2, transconductance amplifier 11 comprises FETs M1 and M2 of first conductivity type, here n-channel FETs, with the sources of FETs M1 and M2 being connected together and the gates of FETs M1 and M2 being connected to the first and second differential input terminals 21, 22 respectively. A bias source 39, comprising FETs M17 and M18, provide a bias current to the transconductance amplifier 11.

The input currents produced by the transconductance amplifier 11 on lines 23 and 24 respectively, are each split by frequency dependent current dividers 12, 13. Each current divider includes a pair of cascode transistors. The cascode transistors are provided with different loads so that frequency dependent current division takes place. In particular, the negative input current $i_{in}^-$ on line 23 is divided at lines 25a and 25b, between an FET M5 of second conductivity type and an FET M8 of second conductivity type.

Transistors M5 and M8 are connected in a cascode connection, with the sources of transistor M5 and M8 being connected to line 25. The drain of transistor M5 is connected to the inverting output terminal 33. The drain of transistor M5 is also connected to the output of a first cascoded current mirror comprising transistors M9, M13, M11, and M15 via line 31. The input of a second cascoded current mirror, comprising transistors M10, M12, M14 and M16, is provided to transistor M8 via transistor M12. Accordingly, at low frequencies, transistor M5 presents a high impedance because of its high impedance load by output transistors M9 and M13 of the first cascoded current mirror, while transistor M8 presents a low impedance because of its low impedance load by input transistors M12 and M16 of the second cascoded current mirror. Most of the low frequency current signal therefore flows into transistor M8.

Similar operations are produced at the positive current input $i_{in}^+$ on line 24 which is produced at the drain of transistor M2. The output current from transistor M2 on line 24 is provided to a pair of cascode transistors M7 and M6 via lines 26a and 26b respectively. At low frequencies, transistor M6 presents a high impedance because of its high impedance load by output transistors M10 and M14 of the second cascoded current mirror. In contrast, transistor M7 produces a low impedance because of its low impedance load by input transistors M11 and M15 of the first cascoded current mirror. Accordingly, most of the low frequency current signal flows into transistor M7.

Transistors M3 and M4 act as current sources 37, 38. Transistors M5 and M6 also provide the current feedback buffers 14 and 15 respectively, to complete the positive feedback loop. Alternatively, separate buffers may be provided. With the combined operation of the current dividers and current buffers, a high low frequency gain is provided.

The frequency dependence of the current dividers, 12, 13 is preferably determined by the capacitive loading applied to the output terminals 33, 34, and may be approximated by the following relationship. It can be shown that the frequency dependent current divider delivers its input current signal substantially to its inverting output for:

$$\omega < \frac{1}{2g_{m8}(r_{o1} \| r_{o3})r_{o5}C_L} \quad (1)$$

where $\omega$, $g_{m8}$, $r_{o1}$, $r_{o3}$, $r_{o5}$, and $C_L$ denote radial frequency, transconductance of M8, drain-to-source resistance of M1, drain-to-source resistance of M3, drain-to-source resistance of M5, and the loading capacitance of the output, respectively. As the frequency is increased above (1), the quantity of the input current signal delivered to the inverting output is monotonically reduced, while increasing the quantity delivered to the non-inverting output, for frequencies up to $$\omega = \frac{1}{r_{o5}C_L} . \text{ For}$$

$$\omega > \frac{1}{r_{o5}C_L} \quad (2)$$

the current signal is divided equally between the inverting and non-inverting outputs of the frequency dependent current divider. Also in the preferred embodiment, feedforward compensation is provided by feedforward capacitors CF1, CF2. At high frequencies, the feedforward capacitors bypass all the current signal to the noninverting output path of the corresponding current divider. This further reduces the gain of the operational amplifier during the presence of excess phase shift to thereby provide additional frequency stability to the operational amplifier.

An operational description of the fully differential amplifier of the present invention will now be provided. Considering half of the differential signal, an input voltage $V_{in}$+ at the gate of M1 generates an input current on line 23. At the drain node of M1, this current sees multiple current paths formed by cascode transistors M5 and M8. The cascode impedance looking into the source of M5 is on the order of output impedances exhibited by transistors M1 and M3, since the drain of M5 has a high impedance cascode load consisting of transistors M9 and M13. The other cascode transistor M8, only has two diode-connected transistors M12 and M16 in series as a load. Therefore, the current path into M8 has an impedance of approximately 1/$g_{m8}$, where $g_{m8}$ is the transconductance of the transistor M8. Since the current path into M8 has a significantly lower impedance compared to all other competing current paths attached to the cascode node, the majority of input current flows into the source of M8 at low frequencies. By the current mirror action of M10, M12, M14 and M16, nearly all of the input current is effectively mirrored onto the non-inverting output of the amplifier at line 34.

In order to carry out the current positive feedback, the current at the noninverting output (line 34) is fed back to the input section in a noninverting fashion. The current at the noninverting output flows to the other cascode node (the drain node of transistor M2), through transistor M6. Since the impedance looking into the source of M7 is negligible compared to the impedance as exhibited by other competing current paths at this cascode node, the majority of the current flows into the source of M7. By the current mirror action of M9, M11, M13 and M15, this current is effectively mirrored onto the inverting output at line 33. The resulting current at the inverting output flows back into the original cascode node (the drain node of M1) through M5. It will be understood by those having skill in the art that analogous operation may be described for the other half of the input signal at the gate of M2.

Thus, the current at the noninverting output is effectively fed back to the starting point in noninverting fashion with minimum attenuation. This positive feedback provides a bootstrapping action with a high effective current gain, approximately equal to the transistor's intrinsic gain ($g_m r_o$). The above operation may be contrasted with known folded cascode fully differential operational amplifiers, in which the output voltage is diminished considerably because less than the full input current is available to generate a voltage across a load. This problem is magnified when, in order to provide a high output impedance, low frequency impedance of the cascode is made on the order of the output impedance of the transistor, which causes current division. This current division requires the output voltage to be generated by only part of the input current. Thus, cascode gains utilizing conventional circuit architectures fall short of their theoretical value.

The dominant pole of the fully differential amplifier of the present invention is determined by the equivalent impedance looking into the outputs 33, 34 of the amplifier and the output capacitive loading. The equivalent output impedance of the amplifier is approximately the parallel cascode impedance looking into the drains of M5 and M9 (or M6 and M10). At frequencies above the dominant pole frequency, the cascode impedance looking into the drain of M5 (or M6) is greatly reduced due to the lowering of the effective output impedance. Thus, the input generated incremental current is equally distributed between cascode transistors M5 and M8 (or M6 and M7).

Because the cascode node at the drain of M1 or M2 can have a large intrinsic capacitance, the nondominant pole may be too close to the unity gain loop transmission frequency. This problem may be alleviated by inserting feedforward capacitor CF1 across the cascode transistor M5 and feedforward capacitor CF2 across the cascode transistor M6. The feedforward capacitors allow the signals to effectively bypass the cascode transistor at high frequencies. Since the cascode transistors are used to achieve large low frequency gain, they may be removed from the signal path for high frequency operation. Feedforward capacitors need not be inserted across the other pair of cascode transistors M7 or M8, since they do not provide a direct signal path to the outputs.

An important consideration for fully differential amplifiers is the symmetric operation under the full range of inputs, including large signal inputs. The merger of the inverting and noninverting signal paths in the fully differential operational amplifier of the present invention allows the differential slewing behavior of the fully differential topology to be symmetric. In other words, under a large input transient which, for example, is applied to the noninverting input $V_{in}$+, transistors M5, M8 and M2 are effectively forced to turn off. This dynamically cuts off the current mirror action provided by M10, M12, M14 and M16. As a result, the operational amplifier enters slew rate operation. The bias current source of transistor M4 is therefore split equally into transistors M6 and M7. While half of the bias current flows into the noninverting output through transistor M6, the other half flows into transistor M7 and subsequently into the diode-connected transistors M11 and M15. By the current mirror action of M9, M11, M13 and M15, the current in M7 is effectively mirrored into the inverting output of the operational amplifier. As a result, inverting and noninverting outputs exhibit a symmetric slew rate. It will be understood that the slew rate is not dependent on the biasing of the output sections in the operational amplifier. Thus, the present invention effectively decouples the undesirable gain and slew rate relationship inherent in general class A amplifiers. The gain of the operational amplifier may be increased by reducing the biasing of the output transistors without degrading its slew rate performance. Similar operation may be described for a large input transmission which is applied to the inverting input $V_{in}^-$.

The fully differential operational amplifier of the present invention also suppresses the common mode signal due to the merged structure of the operational amplifier. It has already been described how the differential positive feedback action is achieved by merging the inverting and noninverting signal paths. In contrast to the differential operation, the common mode behavior appears in both the inverting and noninverting paths in identical function. Therefore, the positive feedback loop is not seen by the common mode signal. As a result, the common mode gain is significantly lower than the differential mode gain. Thus, the fully differential operational amplifier of the present invention typically has sufficient inherent common mode rejection such that the need for auxiliary common mode feedback may be eliminated. This gives significant improvement in the differential performance over the conventional implementation with auxiliary common mode feedback, in terms of linearity, dynamic range, settling time and noise.

It will be understood by those having skill in the art that the cost of obtaining this improvement is typically insignificant. In comparison to the conventional folded cascode operational amplifier, only two cascode transistors M7 and M8 and four diode-connected transistors M11, M12, M15 and M16 need be added. Since the output sections of the operational amplifier typically do not require the external biasing circuit of the conventional counterpart, the effective increase in complexity is minimal.

It will also be understood by those having skill in the art that the transistors M9–M16 should be properly sized and biased so that the common mode voltage does not disturb the linear operation of the operational amplifier. In order to alleviate the difficulty of properly sizing and biasing the transistors, due to unpredictable semiconductor manufacturing tolerances, slow common mode feedback may be added to insure that the outputs swing in balanced fashion. This common mode feedback circuit need only have a small bandwidth since non-DC common mode behavior will be rejected by the operational amplifier.

In order to investigate the improved results of the fully differential operational amplifier of the present invention, the amplifier of FIG. 2 was fabricated using a 2 μm p-well CMOS technology.

The performance of the amplifier of FIG. 2 is compared with a known fully differential folded cascode operational amplifier which was designed with the same transistor sizes and bias currents. The conventional folded cascode operational amplifier did not include transistors M7, M11, M15, M8, M12 and M16. Common mode feedback was added to reject common mode variations and provide common mode biasing. Table 1 illustrates the operational characteristics of the operational amplifier of the present invention and the conventional folded cascode fully differential amplifier.

TABLE 1

| CHARACTERISTICS | INVENTION | CONVENTIONAL |
|---|---|---|
| DC-gain | 84 dB | 78 dB |
| gain bandwidth | 90 MHz | 90 MHz |
| phase margin | 84° | 90° |
| load capacitance | 1.25 pF | 1.25 pF |
| slew-rate limit | 1.60 V/μs | 0.4 V/μs |
| common-mode gain | −42 dB | −30 dB |
| power consumption | 13 mW | 13 mW |
| output swing | 2.8 V | 1.0 V |
| supply voltage | 5.0 V | 5.0 V |

It may be seen that the DC gain of the amplifier of the present invention is significantly higher than the conventional amplifier, using transistors with the same gain-bandwidth. The slew rate of the operational amplifier of the present invention is significantly improved over the conventional operational amplifier. The output swing is also significantly higher for the same supply voltage and power consumption because common mode feedback is not used.

For purposes of simplicity, FIG. 2 did not illustrate the substrate connections of transistors M1–M18. However, these connections will be understood by those having skill in the art. Moreover, although FIG. 2 has been described using p-well CMOS transistors, other transistors may be used. The conductivity types may also be reversed from those shown in FIG. 2. It will also be understood by those having skill in the art that the cascoded current mirrors of the present invention may be implemented using other transistor configurations and the cascode transistors may also be implemented using other cascoding techniques. Similarly, the frequency dependent impedance divider of the present invention may be implemented using topologies other than as illustrated in FIG. 2.

The topology of the present invention may also be used in a high performance single-ended amplifier which includes a single frequency dependent current divider, the noninverting output of which forms the output of the single-ended amplifier. The inverting output is connected to ground. The input of current feedback buffer is connected to the output of the single-ended amplifier and the output of the current feedback buffer is connected to the input of the frequency dependent current divider. An input current may be applied to the input of the frequency dependent current divider via a transconductance amplifier which converts an input voltage to an input current. A bias source may also be provided.

In particular, referring again to FIG. 1, one side of the fully differential amplifier may provide a single-ended amplifier. A single-ended transconductance amplifier 11 may convert an input voltage at terminal 21 to an input current On line 23. The noninverting output 31 of current divider 12 is electrically connected to line 33 to form the amplifier output terminal. The inverting output 32 is connected to ground. Current feedback buffer 14 and bias source 37 are connected as shown in FIG. 1. Current divider 13, Current feedback buffer 15, bias source 38 and the connections thereto are eliminated from FIG. 1.

The single-ended implementation delivers substantially all of its current to the noninverting output 31 of the current divider 12 at low frequencies. At high frequencies, current splitting occurs, leading to reduced positive feedback current gain. High DC gain is thereby provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A fully differential operational amplifier comprising:
   an input differential stage having first and second differential input stage terminals for receiving a pair of differential input signals, and first and second differential stage outputs;
   first and second frequency dependent impedance dividing means, each having an input, a noninverting output and an inverting output;
   the input of said first frequency dependent impedance dividing means being electrically connected to said first differential stage output, and the input of said second frequency dependent impedance dividing means being electrically connected to said second differential stage output; and
   the noninverting output of said first frequency dependent impedance dividing means being electrically connected to the inverting output of said second frequency dependent impedance dividing means, and the inverting output of said first frequency dependent impedance dividing means being electrically connected to the noninverting output of said second frequency dependent impedance dividing means; and
   first and second differential output terminals, said first differential output terminal being electrically connected to the noninverting output of said second frequency dependent impedance dividing means, and said second differential output terminal being electrically connected to the noninverting output of said first frequency dependent impedance dividing means;
   whereby a fully differential output signal is obtained at said first and second differential output terminals.

2. The fully differential amplifier of claim 1 wherein said input differential stage comprises a transconductance amplifier, for converting a differential input voltage between said first and second differential input stage terminals into first and second differential input currents at said first and second differential stage outputs.

3. The fully differential amplifier of claim 2 wherein said transconductance amplifier comprises a pair of field effect transistors of first conductivity type, a respective controlling electrode of which comprises a respective one of said first and second differential input stage terminals, the first controlled electrodes of which are connected to a source of bias current, and the respective second controlled electrodes of which produce said respective first and second differential input currents.

4. The fully differential amplifier of claim 1 wherein said first and second frequency dependent impedance dividing means comprise first and second frequency dependant current dividing means.

5. The fully differential amplifier of claim 4 wherein said first and second frequency dependent current dividing means deliver substantially all of the current at said frequency dependent current dividing means input to the associated inverting output at relatively low frequencies, and split the current at said frequency dependent current dividing means input between the associated noninverting output and inverting output at relatively high frequencies.

6. The fully differential amplifier of claim 4 wherein each of said frequency dependent current dividing means includes first and second cascode transistors, each of which is coupled to the input of said frequency dependent current dividing means.

7. The fully differential amplifier of claim 6 wherein each of said frequency dependent current dividers further comprises a cascoded current mirror, for loading said first and second cascode transistors.

8. The fully differential amplifier of claim 1 further comprising first and second current feedback buffers, said first current feedback buffer electrically coupling said first differential output terminal to the input of said second frequency dependent impedance dividing means, and said second current feedback buffer coupling said second differential output terminal to the input of said first frequency dependent impedance dividing means.

9. A fully differential Field Effect Transistor (FET) operational amplifier comprising:
   first and second differential input terminals and first and second differential output terminals;
   first and second FETs (M1,M2) of first conductivity type, the sources of said first and second FETs being electrically connected together, the gate of said first FET being electrically connected to said first differential input terminal and the gate of said second FET being electrically connected to said second differential input terminal;
   third and fourth FETs (M5, M6) of second conductivity type the source of said third FET being electrically connected to the drain of said first FET and the drain of said third FET being electrically connected to said second output terminal, the source of said fourth FET being electrically connected to the drain of said second FET and the drain of said fourth FET being electrically connected to said first output terminal;
   fifth and sixth FETs (M7,M8) of said second conductivity type, the source of said fifth FET being electrically connected to the drain of said second FET and the source of said sixth FET being electrically connected to the drain of said first FET; and
   first and second cascoded current mirrors, each having an input and an output, the input of said first cascoded current mirror being electrically connected to the drain of said fifth FET, and the output of said first cascoded current mirror being connected to the drain of said third FET; the input of said second cascoded current mirror being electrically connected to the drain of said sixth FET, and the output of said second cascoded current mirror being connected to the drain of said fourth FET.

10. The fully differential amplifier of claim 9 wherein said first cascoded current mirror comprises seventh, eighth, ninth and tenth FETs (M11,M15,M9,M13) of said first conductivity type, the drain of said seventh FET being electrically connected to the drain of said fifth FET, the source of said seventh FET being electrically connected to the drain of said eighth FET, the source of said eighth FET being electrically connected to the source of said tenth FET, the drain of said tenth FET being electrically connected to the source of said ninth FET, and the drain of said ninth FET being electrically connected to said second output terminal, the gate of said seventh FET being electrically connected to the gate of said ninth FET and the drain of said seventh FET, and the gate of said eighth FET being electrically connected to the gate of said tenth FET and the drain of said eighth FET.

11. The fully differential amplifier of claim 10 wherein said second cascoded current mirror comprises eleventh, twelfth, thirteenth and fourteenth FETs (M12,M16,M10,M14) of said first conductivity type, the drain of said eleventh FET being electrically connected to the drain of said sixth FET, the source of said eleventh FET being connected to the drain of said twelfth FET, the source of said twelfth FET being electrically connected to the source of said fourteenth FET, the drain of said fourteenth FET being electrically connected to the source of said thirteenth FET, and the drain of said thirteenth FET being electrically connected to said first output terminal, the gate of said eleventh FET being electrically connected to the gate of said thirteenth FET and the drain of said eleventh FET, and the gate of said twelfth FET being electrically connected to the gate of said fourteenth FET and the drain of said twelfth FET.

12. The fully differential amplifier of claim 9 further comprising first current source means (M17, M18), electrically connected to the sources of said first and second FETs, for supplying current thereto.

13. The fully differential amplifier of claim 9 further comprising second and third current source means (M3,M4), electrically connected to the sources of said third and fourth FETs respectively, for supplying current thereto.

14. The fully differential amplifier of claim 9 further comprising a first capacitor electrically connected between the source and drain of said third FET, and a second capacitor electrically connected between the source and drain of said fourth FET.

15. A fully differential Field Effect Transistor (FET) operational amplifier comprising:
  first and second differential input terminals and first and second differential output terminals;
  first and second FETs (M1,M2) of first conductivity type, the sources of said first and second FETs being electrically connected together, the gate of said first FET being electrically connected to said first differential input terminal and the gate of said second FET being electrically connected to said second differential input terminal;
  third and fourth FETs (M5, M6) of second conductivity type the source of said third FET being electrically connected to the drain of said first FET and the drain of said third FET being electrically connected to said second output terminal, the source of said fourth FET being electrically connected to the drain of said second FET and the drain of said fourth FET being electrically connected to said first output terminal;
  fifth and sixth FETs (M7,M8) of second conductivity type, the source of said fifth FET being electrically connected to the drain of said second FET and the source of said sixth FET being electrically connected to the drain of said first FET;
  first and second cascode FETs (M9,M10) of said first conductivity type said first cascode FET being electrically connected to the drain of said third FET, and said second cascode FET being electrically connected to the drain of said fourth FET, for loading said third and fourth FETs; and
  first and second diode-connected FETs (M11, M12) of said first conductivity type, said first diode-connected FET being electrically connected to the drain of said fifth FET, and said second diode-connected FET being connected to said sixth FET, for loading said fifth and sixth FETs.

16. The fully differential amplifier of claim 15 further comprising:
  third and fourth cascode FETs (M13,M14) of said first conductivity type, a respective one of which is electrically connected to a respective one of said first and second cascode FETs, for further loading said third and fourth FETs; and
  third and fourth diode-connected FETs (M15,M16) of said first conductivity type, a respective one of which is electrically connected to a respective one of said first and second diode-connected FETs, for further loading said fifth and sixth FETs.

17. The fully differential amplifier of claim 15 further comprising first current source means (M17, M18), electrically connected to the sources of said first and second FETs, for supplying current thereto.

18. The fully differential amplifier of claim 15 further comprising second and third current source means (M3,M4), electrically connected to the sources of said third and fourth FETs respectively, for supplying current thereto.

19. The fully differential amplifier of claim 15 further comprising a first capacitor electrically connected between the source and drain of said third FET, and a second capacitor electrically connected between the source and drain of said fourth FET.

20. An amplifier comprising:
  a transconductance amplifier having an input and an output, for receiving an input voltage at the input thereof and for converting said input voltage to an input current at the output thereof;
  frequency dependent current dividing means having an input, a noninverting output and an inverting output, the output of said transconductance amplifier being electrically connected to the input of said frequency dependent current dividing means, the noninverting output forming an amplifier output terminal, and the inverting output being connected to a reference voltage; and
  current feedback buffer means, the input of which is electrically connected to said amplifier output terminal, and the output of which is electrically connected to said input of said frequency dependent current dividing means.

21. The amplifier of claim 20 wherein said frequency dependent current dividing means delivers substantially all of the current at the input thereof to the noninverting output thereof at relatively low frequencies, and splits the current at the input thereof between the inverting and noninverting input thereof at relatively high frequencies.

* * * * *

UNITED STATES PATENT AND TRADEMARK OFFICE
CERTIFICATE OF CORRECTION

PATENT NO. : 5,146,179
DATED : September 8, 1992
INVENTOR(S) : Carley et al.

It is certified that error appears in the above-identified patent and that said Letters Patent is hereby corrected as shown below:

Column 5, line 16, "lo" should be --10--.

Column 5, line 57, "Of" should be --of--.

Column 5, lines 64-65, please delete paragraph break in middle of sentence.

Signed and Sealed this

Twelfth Day of October, 1993

Attest:

BRUCE LEHMAN

*Attesting Officer*  *Commissioner of Patents and Trademarks*